(12) United States Patent
Tsukada

(10) Patent No.: US 8,310,865 B2
(45) Date of Patent: Nov. 13, 2012

(54) SEMICONDUCTOR MEMORY DEVICE HAVING DIODE CELL STRUCTURE

(75) Inventor: Shuichi Tsukada, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 210 days.

(21) Appl. No.: 12/899,106

(22) Filed: Oct. 6, 2010

(65) Prior Publication Data

US 2011/0080776 A1    Apr. 7, 2011

(30) Foreign Application Priority Data

Oct. 7, 2009  (JP) .................................. 2009-233825

(51) Int. Cl.
*G11C 11/00*    (2006.01)

(52) U.S. Cl. .............. 365/163; 365/46; 365/55; 365/74; 365/100; 365/97; 365/131; 365/148; 365/158; 365/171; 365/173; 365/211

(58) Field of Classification Search ..................... 365/46, 365/55, 74, 97, 100, 131, 148, 158, 171, 365/173, 163, 211
See application file for complete search history.

(56) References Cited

U.S. PATENT DOCUMENTS

| 7,898,840 B2 * | 3/2011 | Maejima ........................ 365/148 |
| 7,978,539 B2 * | 7/2011 | Lee et al. .................. 365/189.15 |
| 8,094,482 B2 * | 1/2012 | Wei et al. ...................... 365/148 |
| 2007/0103972 A1 | 5/2007 | Ro et al. | |

FOREIGN PATENT DOCUMENTS

JP    2007-134032    5/2007

* cited by examiner

*Primary Examiner* — Fernando Hidalgo

(74) *Attorney, Agent, or Firm* — McDermott Will & Emery LLP

(57) ABSTRACT

A semiconductor memory device comprises a memory cell, first and second voltage generating circuits generating first and second voltages, and a control circuit. A memory element and a diode included in the memory cell are connected in series between first and second lines. The first voltage has no temperature dependence, and the second voltage has a temperature dependence opposite to that of a forward voltage of the diode. The control circuit detects a resistance state of the memory element in accordance with a change in current flowing in the memory cell in a state where the first/second voltage is applied to the first/second in a read operation of the memory cell.

14 Claims, 9 Drawing Sheets

SEMICONDUCTOR MEMORY DEVICE HAVING DIODE CELL STRUCTURE

BACKGROUND OF THE INVENTION

1. Field of the Invention

The present invention relates to a non-volatile semiconductor memory device for storing data using a change in resistance state of a memory element, and particularly relates to a semiconductor memory device in which a memory cell is formed by connecting the memory element and a diode in series.

2. Description of Related Art

A phase change memory device using structural change of phase change material is known as one of non-volatile semiconductor memory devices. The phase change memory device has a structure in which a resistance value of a phase change element made of the phase change material is changed by heat and thereby data can be rewritably stored. This heat is generated by flowing a large current in the phase change element. When forming a memory cell of the phase change memory device by using a MOS transistor, it is difficult to shrink the cell size in order to obtain a large gate width capable of flowing a large write current. Therefore, a phase change memory device having a diode cell structure has been proposed, in which a diode is used as a select switch for the phase change element (For example, see Patent Reference 1). For example, a phase change memory device shown in FIG. 5 of the Patent Reference 1 has a memory cell array in which a large number of memory cells having the diode cell structure are arranged in a matrix. By employing the diode cell structure, the cell size of each memory cell can be shrank, thereby achieving a high-density arrangement of the memory cells.

Patent Reference 1: Japanese Patent Application Laid-open No. 2007-134032

Generally, in a read operation of a memory cell having the diode cell structure, a predetermined voltage is applied to a selected bit line, and a current flows in a selected word line through the series connected phase change element and the diode. For example, in the phase change memory device disclosed in the Patent Reference 1, a predetermined voltage is applied to a bit line by a read circuit (corresponding to a sense amplifier 170, a bias circuit 150, a precharge circuit 160 and a clamping circuit 140 in FIG. 5 of the Patent Reference 1) driven by a boost voltage VSA of 2.5V, and in a state where a ground potential is applied to the word line, data stored in the phase change element can be determined in accordance with a change in the current flowing in the memory cell.

In order to accurately detect the change in the resistance state of the phase change element in the read operation of the phase change memory device having the diode cell structure, a forward voltage of the diode needs to be maintained constant. However, since current-voltage characteristics of the diode actually has a temperature dependence, the forward voltage of the diode fluctuates at low and high temperatures, which causes a risk that determination accuracy of the resistance state of the phase change element deteriorates. On the other hand, if a supply voltage is stepped down, it is possible to generate a voltage at which the temperature dependence of the diode is cancelled. However, in the configuration example of the Patent Reference 1, the boost voltage VSA applied to the bit line is drastically decreased when assuming the supply voltage of about 1 to 1.5V, and therefore voltage margin (sensing margin) of the read operation of the memory cell cannot be obtained. That is, if the bit line voltage is decreased in a state where the word line is maintained at the ground potential, the voltage applied to the phase change element becomes small, and it becomes difficult to configure the read circuit for detecting the current change. In this manner, in the conventional phase change memory device having the diode cell structure, there is a problem that the temperature fluctuation cannot be suppressed by cancelling the temperature dependence of the diode while obtaining the margin of the read operation.

SUMMARY

The present invention seeks to solve one or more of the above problems and provides a semiconductor memory device capable of suppressing influence of temperature fluctuation of a diode and obtaining excellent sensing margin in a read operation of a memory cell including a phase change element and the diode.

In one of aspects of the invention, there is provided a semiconductor memory device comprising: a memory cell including a memory element and a diode which are connected in series between a first line and a second line; a first voltage generating circuit generating a first voltage having no temperature dependence; a second voltage generating circuit generating a second voltage lower than the first voltage, the second voltage having a temperature dependence opposite to that of a forward voltage of the diode; and a control circuit detecting a resistance state of the memory element in accordance with a change in current flowing in the memory cell in a state where the first voltage is applied to the first line and the second voltage is applied to the second line, in a read operation of the memory cell.

According to the semiconductor memory device of the invention, in the read operation of the memory cell having a diode cell structure, a current flows from the first line applied with the first voltage to the second line applied with the second voltage through the memory cell, and the resistance state of the memory element is detected in accordance with a change in the current. At this point, since the first voltage has no temperature dependence and the second voltage has a temperature dependence opposite to that of the diode, it is possible to determine the resistance state of the memory element in a state where the temperature dependence of the forward voltage of the diode is cancelled. Thus, in the semiconductor memory device, excellent sensing margin can be obtained within a wide temperature range and the configuration of the control circuit can be simplified.

For example, the first line may be a bit line and the second line may be a word line. In this case, the first voltage applied to the bit line may be set to a positive voltage between a supply voltage and a ground potential, and the second voltage applied to the word line may be set to a negative voltage lower than the ground potential. Further, when employing an arrangement including a plurality of memory cells formed at intersections of a plurality of bit lines and a plurality of word lines, the above-mentioned configuration and voltage relation can be applied to each of the memory cells.

According to the present invention, in the semiconductor memory device employing the diode cell structure in which the memory cell is formed using the memory element and the diode, when the forward voltage of the diode has the temperature dependence, influence due to temperature fluctuation in reading the memory cell can be suppressed by giving an opposite temperature dependence to the second voltage. In this case, if the second voltage is set to a negative voltage, the first voltage can be set to a low positive voltage (for example, 0.5V). Therefore, it is possible to easily configure the control circuit (particularly, the read circuit) without using a boost voltage used in the conventional configuration.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, the embodiments will be described in which the present invention is applied to a phase change memory device storing data in a memory cell employing the diode cell structure.

Figure 1:
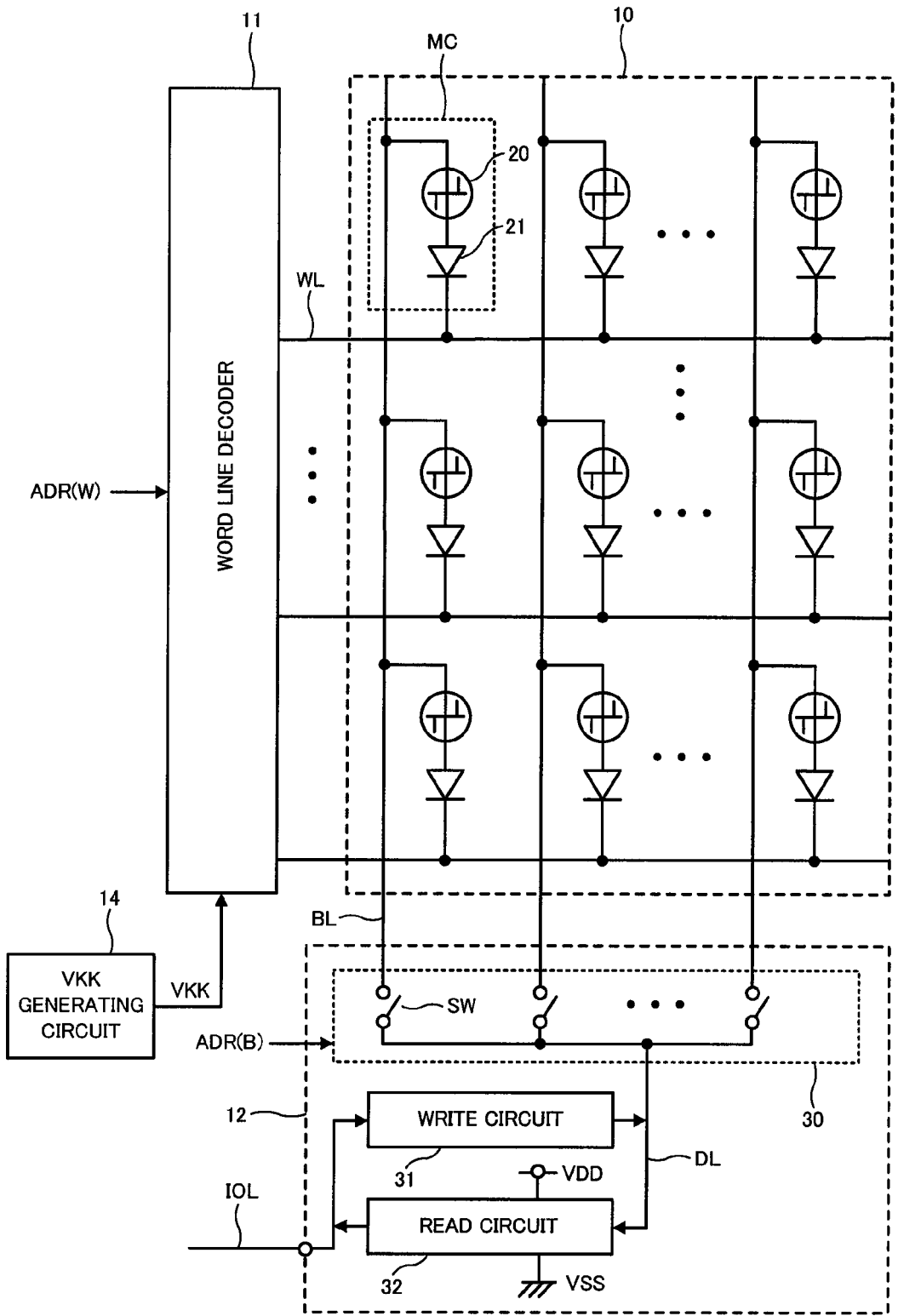
FIG. 1 is a diagram showing a basic configuration of a phase change memory device to which the present invention is applied.

FIG. 1 is a diagram showing a basic configuration of the phase change memory device to which the present invention is applied. In FIG. 1, a memory cell array 10 includes a large number of memory cells MC arranged in a matrix, and there are provided a word line decoder 11, a bit line control circuit 12 and a VKK generating circuit 14 around the memory cell array 10. Further, the bit line control circuit 12 includes a bit line decoder 30, a write circuit 31 and a read circuit 32.

In the memory cell array 10, a plurality of the memory cells MC each employing the diode cell structure are arranged at intersections of a plurality of bit lines BL (the first lines of the invention) and a plurality of word lines WL (the second lines of the invention). Each of the memory cells MC is composed of a phase change element 20 (the memory element of the invention) and a diode 21 which are connected in series. One end of the phase change element 20 is connected to the bit line BL, and the cathode of the diode 21 is connected to the word line WL. The phase change element 20 is made of, for example, chalcogenide phase change material (for example, Ge, Sb and Te). In a multi-layer structure of the phase change memory device, an electrode located immediately below the phase change element 20 is used as a heater, and the phase change element 20 is heated by the heater when a write current flows in the memory cell MC, so that its state can be reversibly changed between a high-resistance amorphous state and a low-resistance crystalline state. In addition, positions of the phase change element 20 and the diode 21 can be replaced with each other in the memory cell MC.

The word line decoder 11 decodes an input word line selecting address ADR (W) and drives a word line WL selected among the plurality of word lines WL according to the decoding result. The VKK generating circuit 14 generates a negative voltage VKK to be applied to the selected word line WL and outputs it to the word line decoder 11. In a read operation of the memory cell array 10, the selected word line WL is controlled so that its level is maintained at the negative voltage VKK, as described later. Meanwhile, non-selected word lines WL are controlled to be maintained at the ground potential VSS. When retaining data in the memory cell array 10, all the word lines WL are maintained at the ground potential VSS. Moreover, the phase change memory device includes a VBLP generating circuit 13 and a reference voltage generating circuit 15 which are not shown in FIG. 1. In addition, configuration and operation of the VKK generating circuit 14 and the VBLP generating circuit 13 will be described later.

The bit line decoder 30 of the bit line control circuit 12 (the control circuit of the invention) includes a plurality of switches SW connected to the plurality of bit lines BL, decodes an input bit line selecting address ADR(B), and connects a bit line BL selected according to the decoding result to a data line DL via each of the switches SW. For example, an MOS transistor whose conductivity is controlled by a control signal applied to its gate is used as each of the switches SW of the bit line decoder 30. As described above, it is possible to select an arbitrary memory cell MC in the memory cell array 10 by specifying the word line selecting address ADR(W) and the bit line selecting address ADR(B).

The write circuit 31 of the bit line control circuit 12 has a well-known circuit configuration and amplifies data inputted through an input/output signal line IOL so as to send the data to the data line DL, in a write operation of the memory cell array 10. This data is sent from the write circuit 31 to the bit line decoder 30 and is written into a predetermined memory cell MC through a bit line BL corresponding to the bit line selecting address ADR(B).

The read circuit 32 of the bit line control circuit 12 receives data, which is readout from the memory cell MC in the read operation, through the bit line decoder 30 and the data line DL and amplifies the data so as to send it to the input/output signal line IOL, in the read operation of the memory cell array 10. As shown in FIG. 1, a supply voltage VDD and a ground potential VSS are supplied to the read circuit 32.

Figure 2:
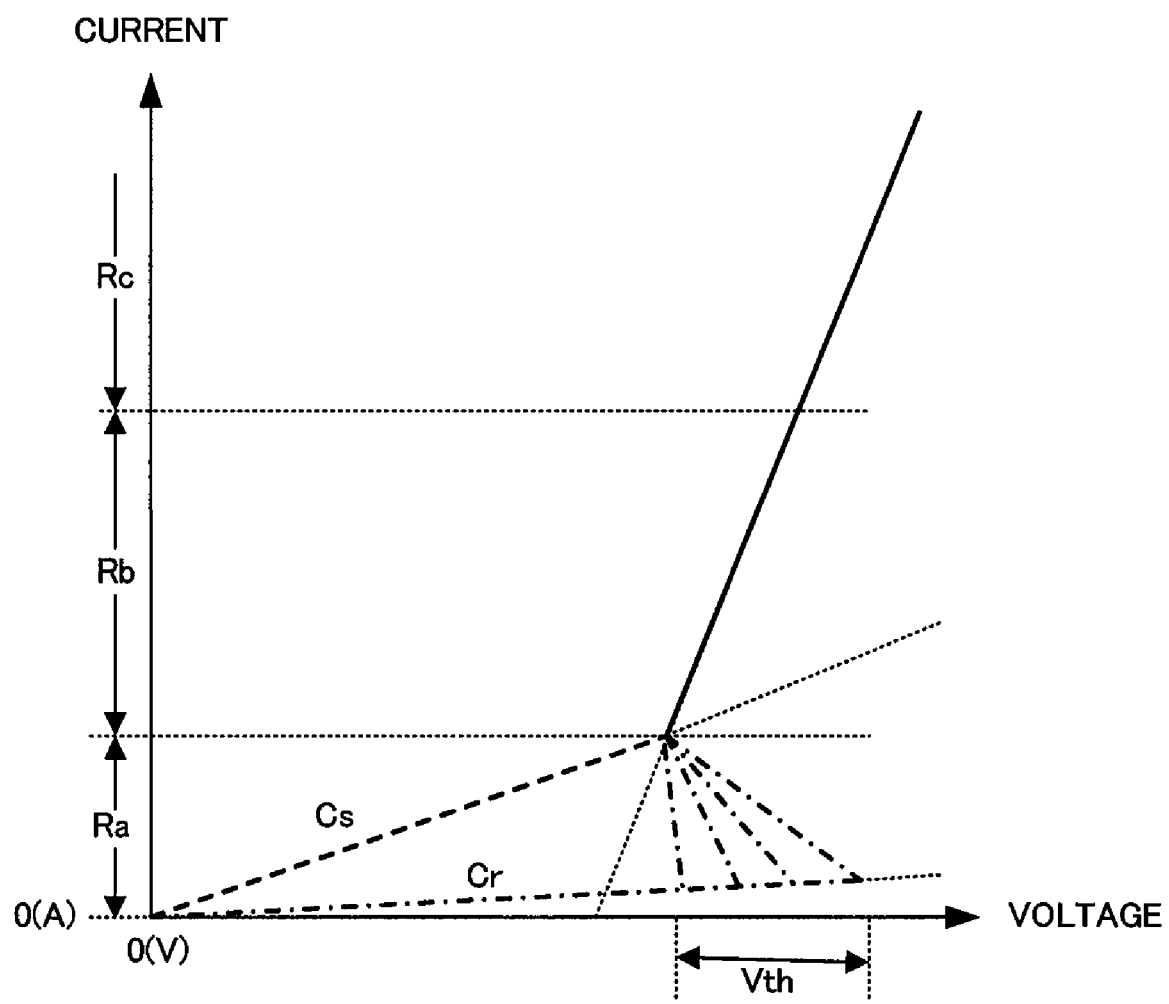
FIG. 2 is a diagram showing an example of general voltage-current characteristics of a phase change element.

Here, characteristics of the phase change element 20 and the diode 21 of the memory cell MC will be described with reference to FIGS. 2 and 3. FIG. 2 shows an example of general voltage-current characteristics of the phase change element 20. In FIG. 2, there are divided regions including a region Ra in the read operation with a small current, a region Rb in which the phase change element 20 shifts to the low-resistance crystalline state in a set write operation, and a region Rc in which the phase change element 20 shifts to the high-resistance amorphous state in a reset write operation. Further, in the region Ra, there are shown a characteristic Cs in which the phase change element 20 is in a low-resistance state and a characteristic Cr in which the phase change element 20 is in a high-resistance state.

Slopes of two characteristics Cs and Cr in the region Ra correspond to reciprocals of respective resistances. Thus, it is found from FIG. 2 that a resistance (reset resistance) of the characteristic Cr having a small slope is larger than a resistance (set resistance) of the characteristic Cs having a large slope. Generally, the phase change element 20 maintaining a high reset resistance is defined as logic "0", and the phase change element 20 maintaining a low set resistance is defined as logic "1". For example, the reset resistance is about 1 MΩ, and the set resistance is about 30 kΩ.

In the write operation, the voltage applied to the phase change element 20 in the reset state is increased, and when the voltage exceeds a threshold voltage Vth of FIG. 2, a large current suddenly flows, thereby shifting to the region Rb (set writing). Further, when a larger voltage is applied to the phase change element 20, a much larger current flows, thereby shifting to the region Rc (reset writing). In the set writing, the phase change element 20 is gradually heated and shifts to the crystalline state. In the reset writing, the phase change element 20 is melted by the heat generated by the much larger current within a short time and thereafter is rapidly cooled so as to shift to the amorphous state. In addition, the threshold voltage Vth varies widely depending on process or temperature, and the lower limit of the variation of the threshold voltage Vth is about 0.6V. Therefore, in consideration of margin, the voltage applied to the phase change element 20 in the read operation is desired to be set to about 0.3V.

Figure 3:
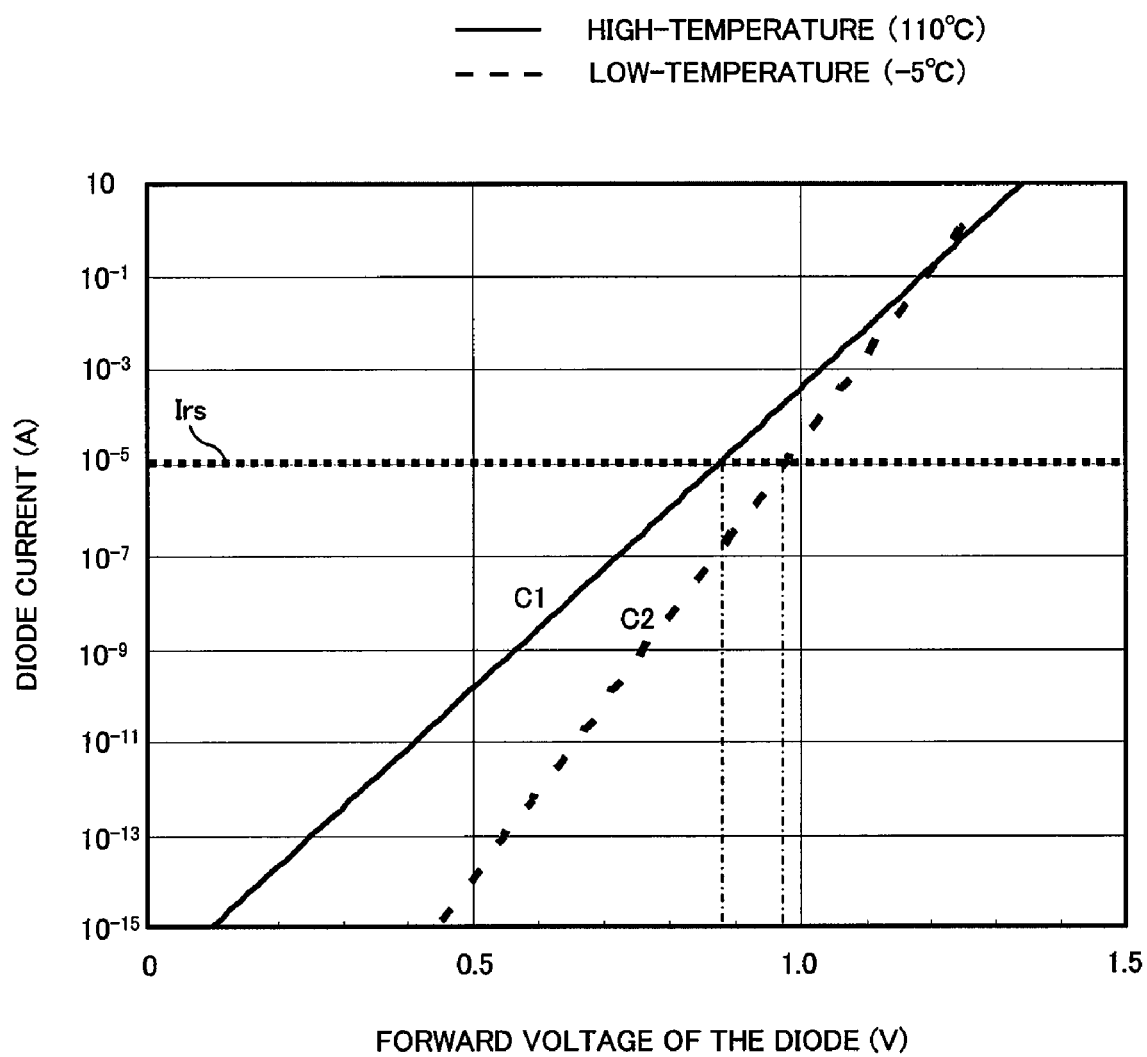
FIG. 3 is a diagram showing an example of general voltage-current characteristics of a diode.

FIG. 3 shows an example of general voltage-current characteristics of the diode 21. In FIG. 3, the horizontal axis indicates a forward voltage of the diode 21, and the vertical axis indicates logarithmic values of the diode current, and a characteristic C1 in the high temperature and a characteristic C2 the low temperature are compared. Further, a read current Irs during the read operation of the phase change element 20 in the set state is shown overlapped with the characteristics C1 and C2. As understood from FIG. 3, the high-temperature characteristic C1 and the low-temperature characteristic C2 are different from each other due to the temperature dependence of the diode 21, and a voltage value of an intersection between the read current Irs and the low-temperature characteristic C2 (0.98V) is larger than that between the read current Irs and the high-temperature characteristic C1 (0.88V).

Figure 4:
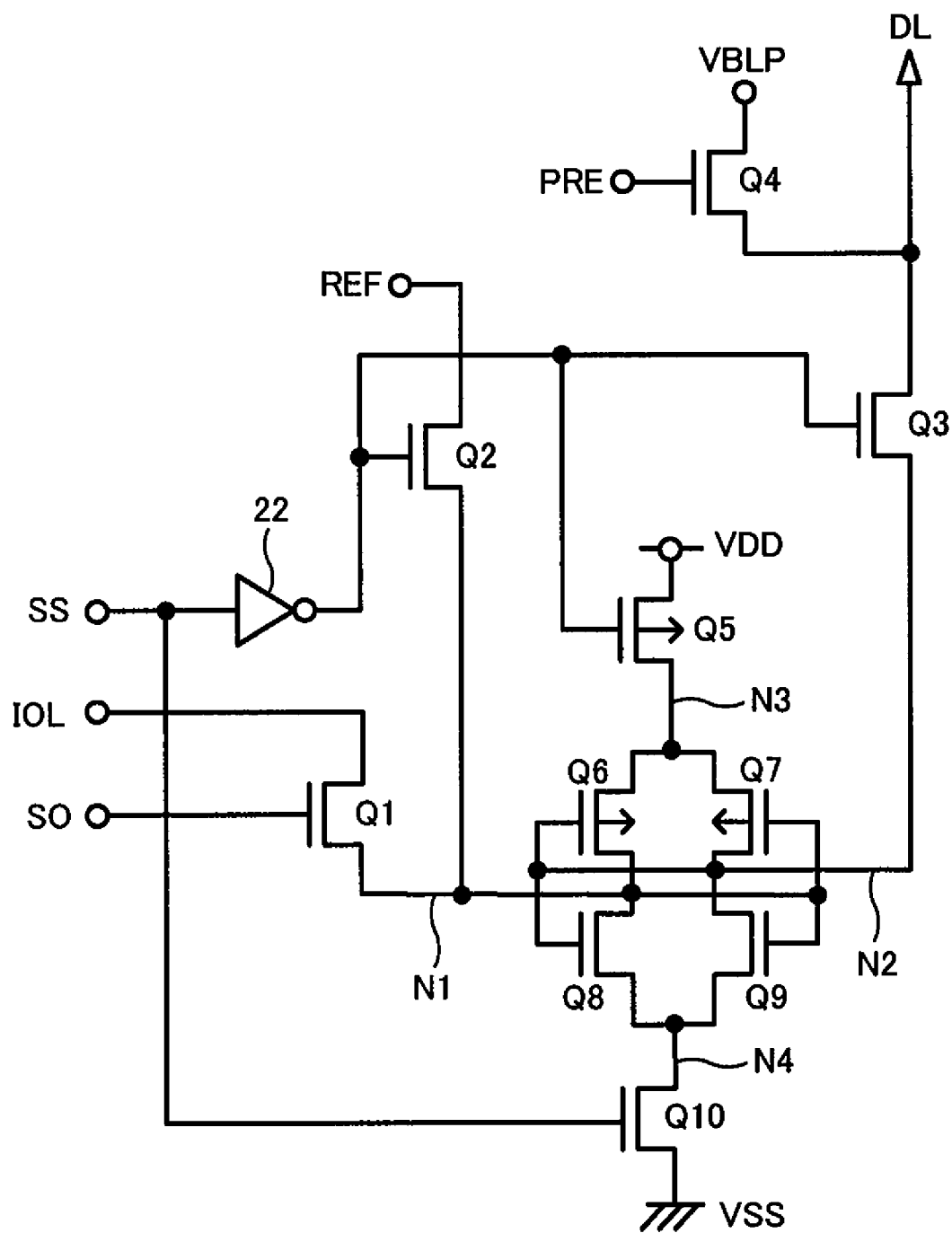
FIG. 4 is a diagram showing a specific circuit configuration of a read circuit.

Next, FIG. 4 shows a specific circuit configuration of the read circuit 32. The read circuit 32 shown in FIG. 4 includes ten transistors Q1 to Q10 and an inverter 22. Each of transistors Q5, Q6 and Q7 is a PMOS-type transistor and each of transistors Q1 to Q4, Q8, Q9 and Q10 is an NMOS-type transistor. Among these, a pair of transistors Q6, Q8 and a pair of transistors Q7, Q9 form a latch circuit, which latches a signal transmitted via a node N2 in the read operation and outputs it via a node N1. A node N3 is connected to the supply voltage VDD via the transistor Q5, and a node N4 is connected to the ground potential VSS via the transistor Q10.

The input/output signal line IOL is connected to the node N1 via the transistor Q1, and the transistor Q1 is controlled in response to an output signal SO applied to its gate. Further, the signal at the node N1 is connected to a reference signal REF via the transistor Q2. Meanwhile, the data line DL is connected to the node N2 via the transistor Q3, and is connected to a positive voltage VBLP via the transistor Q4 for precharging. In a precharge operation, the transistor Q4 is controlled in response to a precharge signal PRE applied to its gate. Further, an inverted signal of a sensing signal SS is applied to gates of the transistors Q2 and Q3 via the inverter 22. In the configuration of the embodiment, since the low positive voltage VBLP is applied to the bit line BL, as different from the conventional configuration (for example, see FIG. 5 of the Patent Reference 1), the read circuit 32 can be operated by the supply voltage VDD without using an internally boosted supply voltage.

Figure 5:
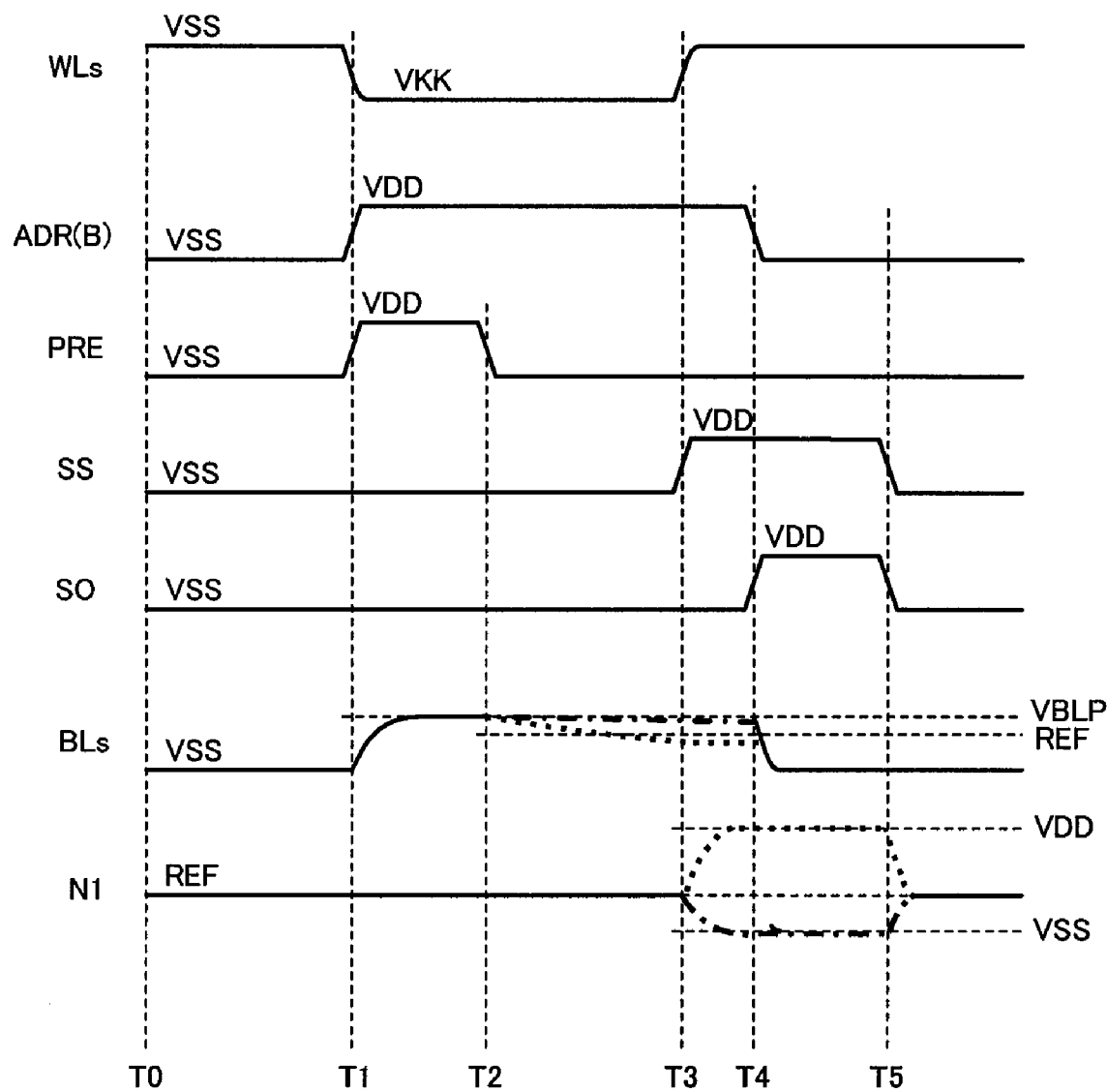
FIG. 5 is a diagram showing operation waveforms in a read operation of the phase change memory device.
Figure 6:
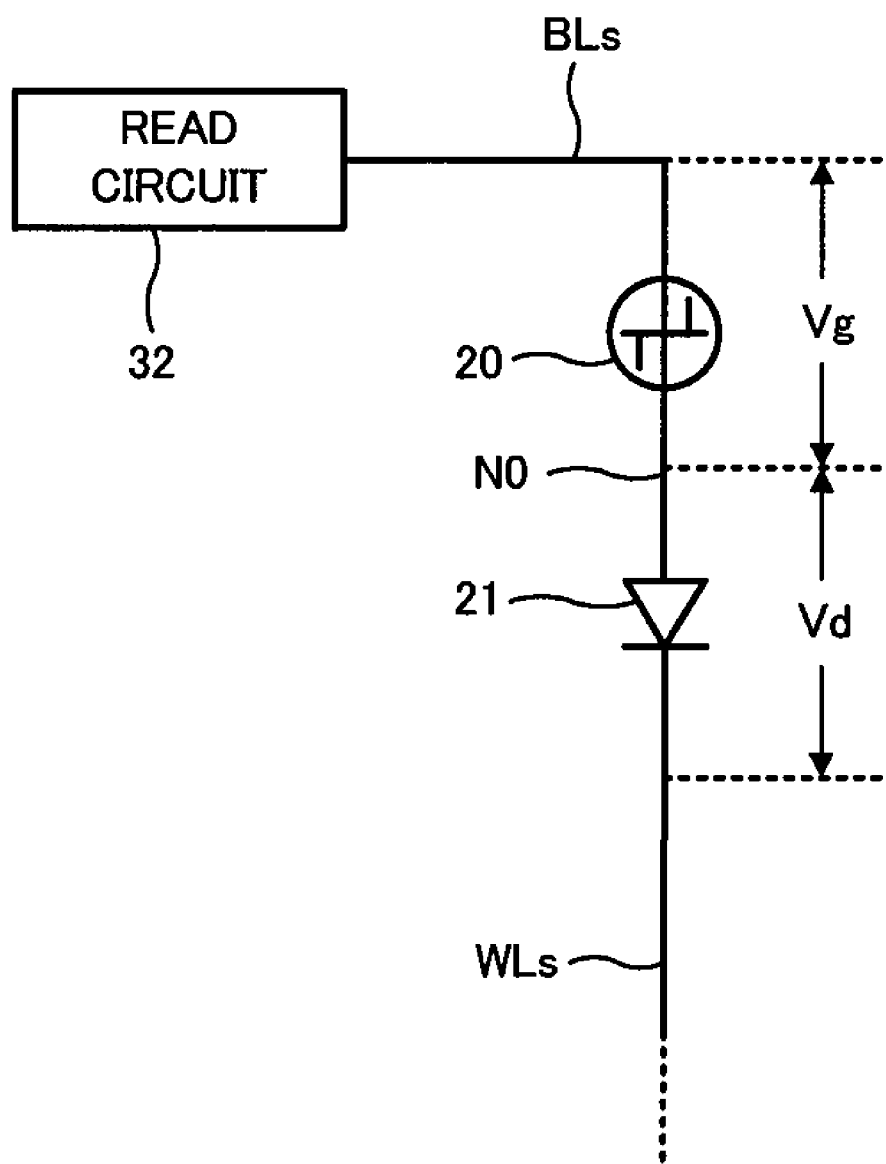
FIG. 6 is a diagram showing an equivalent circuit of a current path in the read operation from the read circuit to a word line through a memory cell to be read.

Next, the read operation of the phase change memory device of the embodiment will be described with reference to FIGS. 5 and 6. FIG. 5 shows operation waveforms in the read operation of the phase change memory device. In FIG. 5, operation waveforms of a word line WLs and a bit line BL respectively selected corresponding to the memory cell MC to be read and an operation waveform of the bit line selecting address ADR(B) are shown, and additionally operation waveforms of the precharge signal PRE, the sensing signal SS, the output signal SO and the node N1 respectively in the read circuit 32 of FIG. 4 are shown for comparison. Meanwhile, FIG. 6 shows an equivalent circuit of a current path in the read operation from the read circuit 32 to the word line WLs through the memory cell MC to be read. In FIG. 6, the read circuit 32, the bit line BLs, the phase change element 20 and the diode 21 of the memory cell MC, and the word line WLs are only illustrated for simplicity. Further, a voltage between both ends of the phase change element 20 is represented as Vg, a voltage between both ends of the diode 21 is represented as Vd, and an intermediate node therebetween is a node N0.

First, the word line WLs and the bit line BLs are in an inactivated state at timing T0 as a standby state before the read operation, and both levels of the word line WLs and the bit line BLs are set to the ground potential VSS. In the state of FIG. 6, current dose not flow through the current path. Further, the precharge signal PRE, the sensing signal SS, the output signal SO and the bit line selecting address ADR (B) are also in the inactivated state at the timing T0 and set to a low level (the ground potential VSS) respectively. In addition, the node N1 is set to the same level as the reference signal REF by an operation of the transistor Q2 and the inverter 22 in FIG. 4.

Next, the word line WLs is selected by the word line decoder 11, and consequently the level of the word line WLs decreases from the ground potential VSS to the negative voltage VKK at timing T1. At this point, the precharge signal PRE is changed to a high level (the supply voltage VDD) so that the transistor Q4 turns on, and the positive voltage VBLP is supplied to the data line DL of FIG. 4. Thus, the level of the bit line BLs which is connected to the data line DL via the switch SW of the bit line decoder 30 increases from the ground potential VSS to the positive voltage VBLP. Meanwhile, non-selected bit lines are maintained at the ground potential VSS. The positive voltage VBLP is set to, for example, about VBLP=0.5V for about VDD=1.8V (1.7 to 1.9V). In addition, the activated bit line selecting address ADR (B) is assumed to be changed to the high level at the timing T1.

Here, in the current path of FIG. 6, the bit line BLs is at the positive voltage VBLP and the word line WLs is at the negative voltage VKK, and the diode 21 of the memory cell MC is forward-biased so that the current flows. The read operation is controlled so that a current corresponding to, for example, about Vg=0.3V flows in the phase change element 20. Then, the current value in the current path varies in accordance with the resistance state of the phase change element 20, and the logic "0" or "1" stored in the memory cell MC can be determined by detecting the current value. In FIG. 6, the negative voltage VKK is a voltage obtained by subtracting the voltage applied to the memory cell MC (sum of the voltages Vg and Vd) from the positive voltage VBLP. That is, this satisfies the following relation:

$$VKK = VBLP - (Vg + Vd)$$

In the embodiment, the value of the negative voltage VKK is appropriately controlled in consideration of the temperature dependence of the diode 21, and a specific operation thereof will be described later.

Subsequently, the precharge signal PRE is changed from the high level to the low level so that the transistor Q4 turns off at timing T2, and precharging of the bit line BLs is cancelled. Therefore, the level of the bit line BLs gradually changes in accordance with the resistance state of the phase change element 20 of the selected memory cell MC. Then, as shown in FIG. 5, the bit line BLs decreases to a level lower than the reference signal REF when the phase change element 20 is in the low-resistance state (set state), and the bit line BLs maintains a level higher than the reference signal REF when the phase change element 20 is in the high-resistance state (reset state).

Subsequently, when the level of the word line WLs returns from the negative voltage VKK to the ground potential VSS at timing T3, the sensing signal SS is changed from the low level to the high level. Thereby, in the latch circuit including the transistors Q6 to Q9 of FIG. 4, the output level is determined in accordance with the level relation between the nodes N1 and N2. That is, as shown in FIG. 5, the node N1 changes to the low level (the ground potential VSS) when the level of the bit line BLs is higher than that of the reference signal REF, and the node N1 changes to the high level (the supply voltage VDD) when the level of the bit line BLs is lower than that of the reference signal REF.

Subsequently, the output signal SO is changed from the low level to the high level at timing T4. Thereby, the transistor Q1 of FIG. 4 turns on, and the signal maintained at the node N1 is outputted to the input/output signal line IOL via the transistor Q1. Further, at the timing T4, the bit line selecting address ADR (B) is changed to the low level while remaining in the inactivated state, and the level of the bit line BLs decreases to the ground potential VSS.

Subsequently, the sensing signal SS and the output signal SO are both changed from the high level to the low level at timing T5. Thereby, the transistor Q1 is turned off, and the transistors Q2 and Q3 are turned on, so that the read operation is completed. At this point, the level at the node N1 returns to the reference signal REF again.

Figure 7:
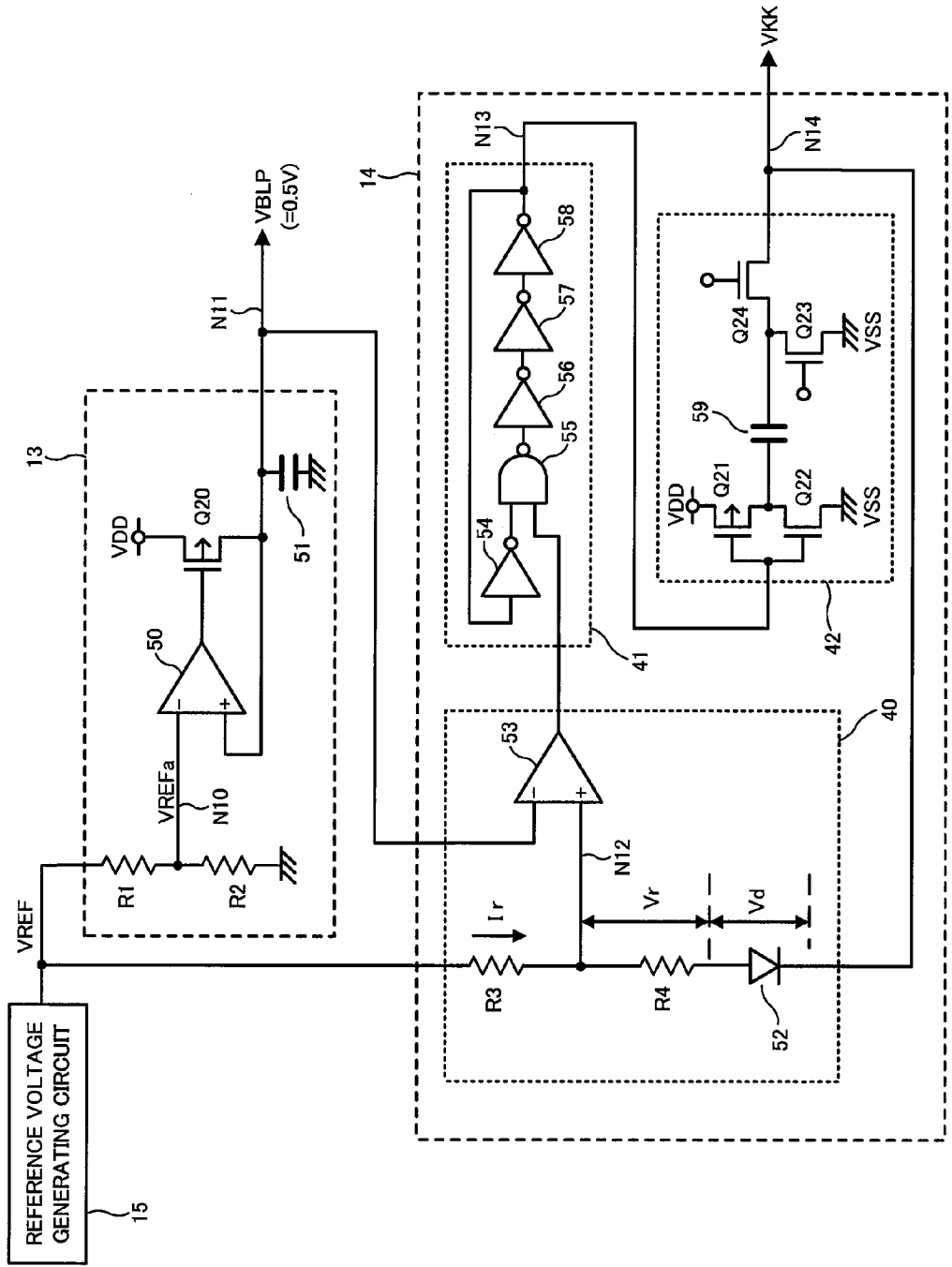
FIG. 7 is a diagram showing an example of circuit configurations of a VBLP generating circuit and a VKK generating circuit.

A feature of the phase change memory device of the embodiment is a voltage control using the negative voltage VKK necessary for driving the word line WL, which will be described in detail below. FIG. 7 shows an example of circuit configurations of the VBLP generating circuit 13 (the first voltage generating circuit of the invention) generating the positive voltage VBLP (the first voltage of the invention) applied to the bit line BL and the VKK generating circuit 14 (the second voltage generating circuit of the invention) generating the negative voltage VKK (the second voltage of the invention) applied to the word line WL. In FIG. 7, a reference voltage VREF is supplied to the VKK generating circuit 14 and the VBLP generating circuit 13 from the reference voltage generating circuit 15 having a well-known circuit configuration. The reference voltage VREF is used as a reference value for the negative voltage VKK and the positive voltage VBLP and has a constant voltage value without the temperature dependence. For example, the reference voltage VREF is set to about 1V.

The VBLP generating circuit 13 generates the positive voltage VBLP based on the reference voltage VREF outputted from the reference voltage generating circuit 15 and includes resistors R1, R2, a differential amplifier 50, a transistor Q20 and a capacitor 51. The resistors R1 and R2 connected in series are connected between the reference voltage VREF and the ground, and a voltage VREFa corresponding to the ratio of the resistors R1 and R2 appears at a node N10 between the resistors R1 and R2. For example, when the two resistors R1 and R2 are equal to each other in a state of VREF=1V, the voltage VREFa becomes 0.5V. The node N10 is connected to a minus input terminal of the differential amplifier 50. The transistor Q20 is a PMOS-type and has a source connected to the supply voltage VDD, a drain connected to a plus input terminal (node N11) of the differential amplifier 50, and a gate connected to an output terminal of the differential amplifier 50. The capacitor 51 is connected between the node N11 and the ground, and the positive voltage VBLP having the same level as the voltage VREFa is outputted from the node N11. As described above, the positive voltage VBLP is maintained at the constant voltage value without the temperature dependence because it is generated based on the reference voltage VREF having no temperature dependence.

The VKK generating circuit 14 is provided with a VKK determination circuit 40, a ring oscillator circuit 41 and a VKK pumping circuit 42. The VKK determination circuit 40 includes resistors R3, R4, a diode 52 and a comparator 53. The resistors R3, R4 and the diode 52 are connected in series and are connected between the reference voltage VREF and a node N14. A node N12 between the resistors R3 and R4 is connected to a plus input terminal of the comparator 53. Here, the diode 52 has the same characteristics as the diode 21 of the memory cell MC. A minus input terminal of the comparator 53 is connected to the node N11 and receives the positive voltage VBPL outputted from the VBLP generating circuit 13. The comparator 53 outputs a detection signal of which the logics 1/0 change in accordance with the level relation between the voltage at the node N12 and the positive voltage VBPL.

The ring oscillator circuit 41 includes inverters 54, 56, 57, 58 and a NAND gate 55. The NAND gate 55 receives the detection signal from the comparator 53 and an output of the inverter 54 respectively, and the inverters 56, 57 and 58 are connected in series in this order to the output side of the NAND gate 55. A node N13 at the output side of the final stage inverter 58 is fed back to the first stage inverter 54. This ring-shaped connection allows the ring oscillator circuit 41 to output a square wave having a predetermined period from the node N13 when the detection signal from the comparator 53 is the logic "1".

The VKK pumping circuit 42 includes transistors Q21, Q22, Q23, Q24 and a pumping capacitor 59. An output of the ring oscillator circuit 41 is applied to commonly connected gates of a PMOS type transistor Q21 and an NMOS type transistor Q22, and commonly connected drains thereof are connected to one end of the pumping capacitor 59. The transistor Q23 is connected between the other end of the pumping capacitor 59 and the ground, and the transistor Q24 is connected between the other end of the pumping capacitor 59 and the node N14. As described above, the cathode of the diode 52 is connected to the node N14, and the voltage at the node N14 is outputted as the negative voltage VKK.ee In the circuit configuration of FIG. 7, if the level at the node N12 is higher than the level of the positive voltage VBLP, the ring oscillator circuit 41 and the VKK pumping circuit 42 are activated so as to decrease the level at the node N14 (VKK), and thereby the level at the node N12 is decreased through the diode 52 and the resistor R4. Further, if the level at the node N12 becomes lower than the level of the positive voltage VBLP, the ring oscillator circuit 41 and the VKK pumping circuit 42 are deactivated. That is, the node N12 is maintained at almost the same level as the positive voltage VBLP (for example, 0.5V). The resistors R3 and R4 are adjusted so that a current Ir flowing through the resistors R3 and R4 is equal to the current flowing through the signal path of FIG. 6 in the set state of the memory cell MC. The adjustment is, for example, R3=50 kΩ and R4=30 kΩ. On the assumption of VREF=1.0V and VBLP=0.5V, its voltage difference of 0.5V is applied to the resistor R3 and a value of the current Ir becomes 10 uA. Accordingly, a voltage Vr of the resistor R4 becomes 0.3V (=10 uA×30 kΩ). Further, the voltage Vd becomes a voltage at each intersection between the read current Irs (=10 uA) and the diode characteristics (C1 and C2) in FIG. 3. In this manner, the feedback of the negative voltage VKK of FIG. 7 is controlled so that the negative voltage VKK conforms to a voltage value obtained by subtracting a sum of the voltages Vr and Vd corresponding to the flowing current Ir from the positive voltage VBLP.

Figure 8:
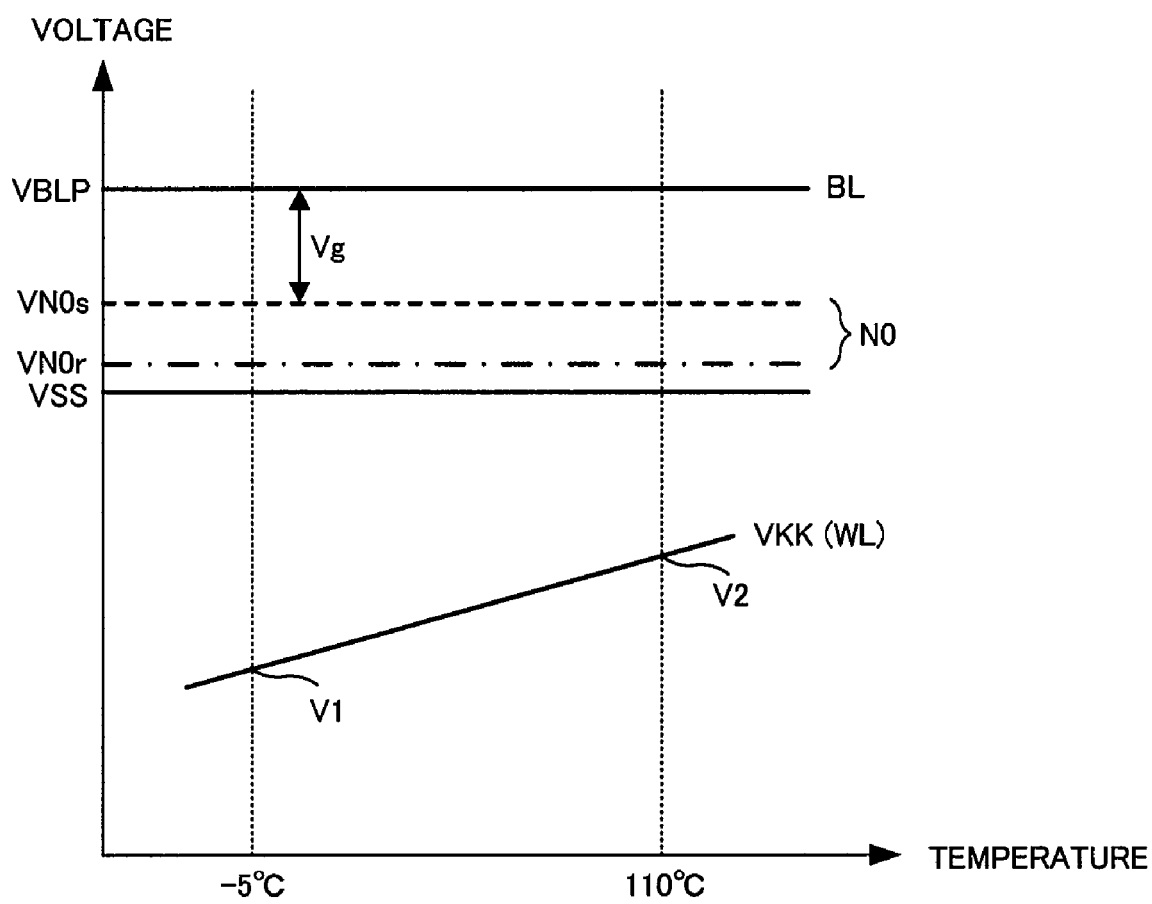
FIG. 8 is a diagram showing voltage-temperature characteristics of FIG. 6 in the read operation.
Figure 9:
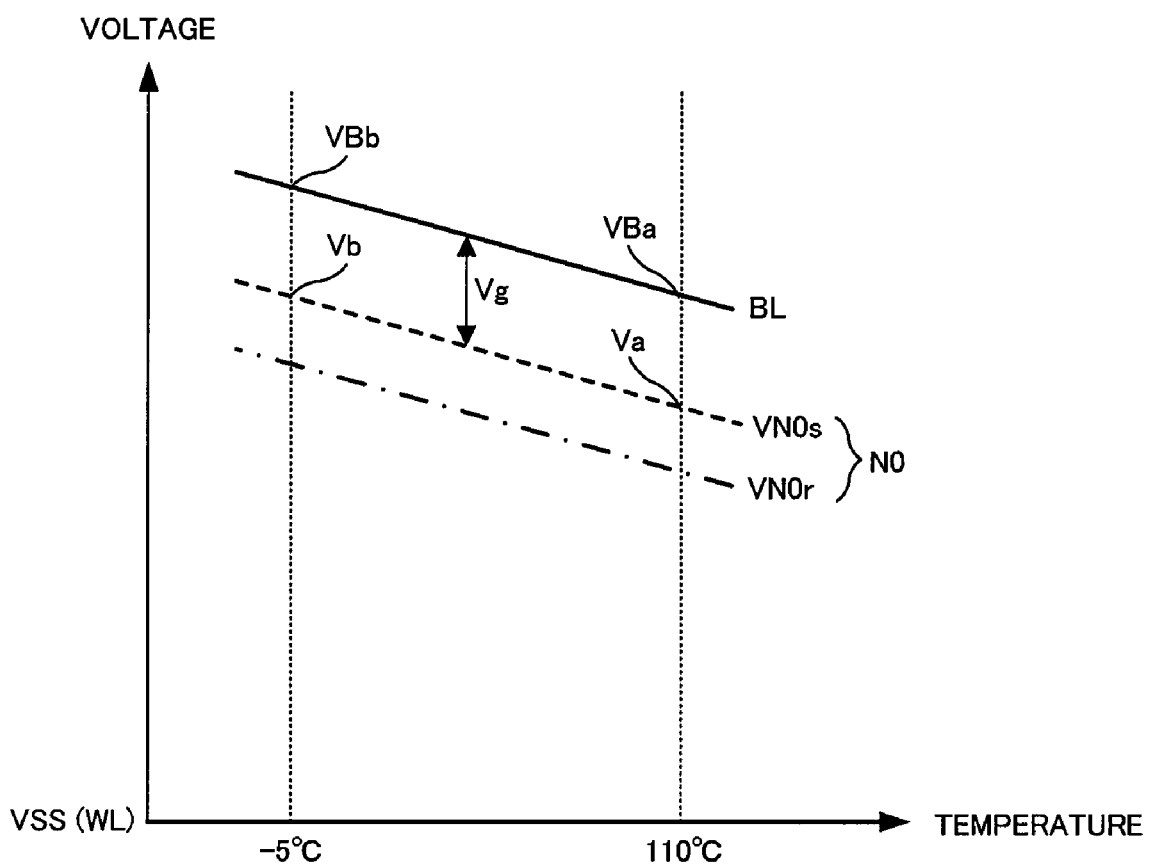
FIG. 9 is a diagram showing voltage-temperature characteristics as a comparison example for the embodiment, corresponding to FIG. 8 in which a conventional configuration is employed.

Hereinafter, voltage-temperature characteristics of FIG. 6 in the read operation will be described with reference to FIG. 8. Further, FIG. 9 shows voltage-temperature characteristics as a comparison example for the embodiment, corresponding to FIG. 8, in which a conventional configuration is employed. FIGS. 8 and 9 show graphs representing temperature dependences of voltages of the memory cell MC within an assumed temperature range (−5 to 110 degrees Celsius).

As shown in FIG. 8, according to the voltage-temperature characteristics of the embodiment, the positive voltage VBLP applied to the bit line BL has no temperature dependence and is maintained at a constant value, and the negative voltage VKK applied to the word line WL gradually increases with a rise in temperature. The negative voltage VKK changes from a minimum voltage value V1 to a maximum voltage value V2 within the temperature range of −5 to 110 degrees Celsius. Meanwhile, as to the node N0 of FIG. 6, a voltage VN0s obtained when the phase change element 20 maintains the set resistance and a voltage VN0r obtained when the phase change element 20 maintains the reset resistance both change flatly because they have no temperature dependence. That is, since the temperature dependence of the forward voltage Vd of the diode 21 is reverse to that of the negative voltage VKK, their changes are cancelled with each other. In addition, the positive voltage VBLP of the bit line BL is higher than the voltage VN0s at the node N0 in the set state by the voltage Vg. A specific example of the voltage relation of FIG. 8 is such that the change of the negative voltage VKK is V1=−0.78V and V2=−0.68V for a condition of VBLP=0.5V and VSS=0V. Further, the voltage at the node N0 is VN0s=0.3V in the set state, and the voltage VN0r becomes slightly higher than the ground potential VSS in the reset state so that the voltage Vg becomes 0.3V.

On the other hand, according to the voltage-temperature characteristics of the conventional configuration as shown in FIG. 9, although the word line WL is maintained at the ground potential VSS having no temperature dependence, the potential of the bit line BL supplied with a boost voltage has the temperature dependence. That is, both the voltage VN0s in a case where the phase change element 20 maintains the set resistance and the voltage VN0r in a case where the phase change element 20 maintains the reset resistance have the same temperature dependence as the forward voltage Vd of the diode 21, and the potential of the bit line BL changes in conjunction therewith. Within the temperature range from −5 to 110 degrees Celsius, the voltage VN0s changes from the maximum voltage value Vb to the minimum voltage value Va, while the potential of the bit line BL higher than the voltage VN0s by the voltage Vg changes from the maximum voltage value VBb to the minimum voltage value VBa. A specific example of the voltage relation of FIG. 9 is Va=0.88, Vb=0.98V, VBa=1.18V, VBb=1.28V and Vg=0.3V corresponding to the characteristics of the diode 21 in FIG. 3.

It is apparent by comparing FIGS. 8 and 9 that, in the embodiment, the negative voltage VKK lower than the ground potential VSS is supplied to the word line WL, the low positive voltage VBLP (for example, 0.5V) can be supplied to the bit line BL. Further, since the negative voltage VKK is controlled to have the temperature dependence opposite to that of the diode 21, it is possible to control so that the read operation of the memory cell MC cannot be affected by the temperature fluctuation. In the conventional configuration, since the voltage applied to the bit line BL is forced to be high, the read operation of the memory cell MC is inevitably affected by the temperature fluctuation, and even if a method for controlling the voltage of the bit line BL in accordance with the temperature, determination accuracy is deteriorated due to variation of operating points in the read circuit 32. Accordingly, in the embodiment, it is possible to improve sensing margin of the memory cell MC without being affected by the temperature fluctuation in comparison with the conventional configuration. On the other hand, in the conventional configuration, in order to achieve a higher-speed read operation, it is necessary to maintain the word line WL at a high voltage and to maintain the bit line BL at the ground potential VSS in a data retention operation (in standby). Thereby, the diode 21 is reverse-biased so as to generate standby leak due to the leak in the diode 21. In contrast, in the embodiment, it is possible to maintain both the word line WL and the bit line BL at the ground potential VSS in the data retention operation (in standby), and the diode 21 is not reverse-biased so that the generation of the standby leak can be prevented.

Further, as apparent from FIGS. 8 and 3, in the read operation, it is not necessary to change voltages of non-selected word lines and non-selected bit lines from the ground potential VSS as the same as in the data retention operation (in standby). A current smaller than the diode current for which the diode forward voltage in the graph of FIG. 3 is 0.5V flows in each of non-selected memory cells (corresponding to non-selected word lines at the ground potential VSS) connected to the selected bit line (to which the positive voltage VBLP of 0.5V is applied), which is sufficiently lower than the read current Irs of the phase change element 20 in the set state, so as almost not to affect the determination of the resistance value of the selected memory cell. Further, the voltage applied to each of non-selected memory cells (corresponding to non-selected bit lines at the ground potential VSS) connected to the selected word line (to which the negative voltage VKK is applied) is V1=−0.78V in the low temperature and is V2=−0.68V in the high temperature. However, the diode current is sufficiently small when the forward voltage of the diode 21 in the graph of FIG. 3 is V1 or V2 in the low or high temperature, and there is not a large increase in consumption current. Accordingly, the read operation can be performed at high speed from a data retention state (in standby), and consumption current due to charge/discharge of the non-selected bit lines and the non-selected word lines is not generated.

Further, in the conventional configuration, since the boost voltage applied to the bit line BL includes ripple noise larger than that of the positive voltage VBLP, there is a problem that the resistance state of the phase change element 20 cannot be accurately detected when the read circuit 32 is driven by the boost voltage. In contrast, in the embodiment, since the read circuit 32 can be driven by the supply voltage VDD, it is possible to accurately detect the resistance state of the phase change element 20. Further, in the conventional configuration, the read circuit 32 driven by the boost voltage needs to be configured using thick film transistors each having a thick gate oxide film. Correspondingly, a layout area is enlarged, and fluctuation of the threshold voltage increases so that the detection accuracy of the read circuit 32 is deteriorated. In contrast, in the embodiment, the read circuit 32 configured using thin film transistors each having a thin gate oxide film can be achieved so that the detection accuracy can be kept excellent.

In the foregoing, contents of the invention have been specifically described based on the embodiments. However, the present invention is not limited to the above described embodiments, and can variously be modified without departing the essentials of the present invention. For example, various configurations can be employed for the bit line control circuit 12, the VBLP generating circuit 13 and the VKK generating circuit 14 without being limited to the configurations of the embodiment, as long as the same purpose can be achieved. Further, semiconductor devices in which the phase change memory device of the invention can be implemented can include SOC (System on Chip), MCP (Multi chip package), POP (Package on Package) and the like. Further, the present invention is not limited to the phase change memory device and can be widely applied to a semiconductor memory device employing the diode matrix cell structure, such as a resistive random access memory (RRAM).

The invention claimed is:

1. A semiconductor memory device comprising:
a memory cell including a memory element and a diode which are connected in series between a first line and a second line;
a first voltage generating circuit generating a first voltage having no temperature dependence;
a second voltage generating circuit generating a second voltage lower than the first voltage, the second voltage having a temperature dependence opposite to that of a forward voltage of the diode; and
a control circuit detecting a resistance state of the memory element in accordance with a change in current flowing in the memory cell in a state where the first voltage is applied to the first line and the second voltage is applied to the second line, in a read operation of the memory cell.

2. The semiconductor memory device as claimed in claim 1, wherein a plurality of bit lines each as the first line and a plurality of word lines each as the second line are arranged, and a plurality of the memory cells are provided at intersections of the plurality of bit lines and the plurality of the word lines.

3. The semiconductor memory device as claimed in claim 2, wherein the first voltage is higher than a ground potential, and the second voltage is lower than the ground potential.

4. The semiconductor memory device as claimed in claim 3, wherein the first voltage is lower than a supply voltage.

5. The semiconductor memory device as claimed in claim 4,
wherein, in a data retention operation, the ground potential is applied to the plurality of the bit lines and the plurality of the word lines,
and, in a read operation, the first voltage is applied to a selected bit line, the second voltage is applied to a selected word line, and non-selected bit lines and non-selected word lines are maintained at the ground potential, among the plurality of the bit lines and the plurality of the word lines.

6. The semiconductor memory device as claimed in claim 4, wherein the first voltage is approximately 0.5 V.

7. The semiconductor memory device as claimed in claim 1, wherein the first voltage generating circuit generates the first voltage lower than a reference voltage having no temperature dependence based on the reference voltage.

8. The semiconductor memory device as claimed in claim 7, wherein the second voltage generating circuit generates the second voltage obtained by subtracting a voltage applied to the memory cell in the read operation from the first voltage, based on the reference voltage and the first voltage.

9. The semiconductor memory device as claimed in claim 8, wherein the second voltage generating circuit includes a series circuit of a diode and a resistor, the diode of the series circuit having same characteristics as the diode of the memory cell, the reference voltage is applied to the resistor at one end of the series circuit, and the second voltage is fed back to a cathode of the diode of the series circuit.

10. The semiconductor memory device as claimed in claim 9, wherein the second voltage generating circuit further includes a comparator comparing a voltage at a predetermined node divided by resistors in the series circuit with a level of the first voltage.

11. The semiconductor memory device as claimed in claim 10, further comprising:
a ring oscillator circuit receiving a signal outputted from the comparator and outputting a square wave having a predetermined period, and
a pumping circuit generating the second voltage based on the square wave outputted from the ring oscillator circuit.

12. The semiconductor memory device as claimed in claim 4, wherein the control circuit includes a read circuit amplifying data read out from the memory cell through a bit line selected among the plurality of bit lines and outputting the data.

13. The semiconductor memory device as claimed in claim 12, wherein the read circuit is driven by the supply voltage.

14. The semiconductor memory device as claimed in claim 1, wherein the memory element is a phase change element rewritably storing data by reversibly changing its state between a low-resistance crystalline state and a high-resistance amorphous state.

* * * * *